United States Patent [19]
Jin et al.

[11] Patent Number: 6,132,568
[45] Date of Patent: Oct. 17, 2000

[54] MANUFACTURING METHOD OF SAMARIUM SULFIDE THIN FILMS

[75] Inventors: Ping Jin; Sakae Tanemura, both of Aichi, Japan

[73] Assignee: Japan as represented by Director General of Agency of Industrial Science and Technology, Tokyo, Japan

[21] Appl. No.: 09/256,222

[22] Filed: Feb. 24, 1999

[30] Foreign Application Priority Data

Feb. 25, 1998 [JP] Japan .................................. 10-062315

[51] Int. Cl.⁷ .................................................. C23C 14/34
[52] U.S. Cl. ............................... 204/192.26; 204/192.15; 204/192.18; 204/192.25; 204/192.27; 204/192.28; 204/298.12; 204/298.13
[58] Field of Search .......................... 204/192.15, 192.25, 204/192.26, 192.27, 192.28, 298.12, 298.13, 192.18

[56] References Cited

PUBLICATIONS

Jin et al., "Growth of Samarium Monosulfide Thin Films by Co–Sputtering Deposition," Journal of Crystal Growth, pp. 285–289 (month unknown), 1988.

Charles B. Greenberg, "Optically Switchable Thin Films: A Review", Thin Solid Films, 251 (1994), pp. 81–93., (Month Unknown).

M.R. Jacobson, et al., "Chemical Vapor Deposition of Samarium Chalcogenides: Progress on Fabricating Thin Film Phase Transition Materials", SPIE vol. 428 (1983), pp. 57–64, Month Unknown).

C. F. Hickey, et al., "Optical Response of Switching SmS in Thin Films Prepared by Reactive Vaporation", j. Appl. Phys. 62(9), Nov. 1, 1987, pp. 3912–3917.

Dieter W. Pohl, et al., "Laser Writing–Reading With SmS Thin Films", Applied Optics, vol. 14, No. 5, May 1975, pp. 1060–1061.

V. V. Kaminskii, et al., "Electrical Properties and Structure Characteristics of Polycrystalline Samarium Monosulfide Films", Sov. Phys. Solid State 33(1), Jan. 1991, pp. 108–111.

T. L. Bzhalava, et al., Sov. Phys. Solid State, vol. 16, No. 12, Jun. 1975, p. 2428.

C. F. Hickey, et al., "SmS Phase Transition in Thin Films Prepared by Reactive Evaporation", Phase Transitions, vol. 14, 1989, pp. 187–199, (Month Unknown).

S.V. Pogarev, et al., "Study of SmS Thin Films With Various Lattice Constants", Sov. Phys. Solid State 23(2), Feb. 1981, pp. 245–248.

M. N. Naboka, et al., "Formation and Structure of Thin Films of Samarium Sulfides", Inorg. Mater. vol. 16, No. 7, Jul. 1980, pp. 806–809.

T. L. Bzhalava, et al., "Metal Modification of SmS in Vacuum–Deposited Films", Physics Letters, vol. 55A, No. 3, Dec. 1, 1975, pp. 161–162.

P. Jin, et al., "Growth of Samarium Monosulfide Thin Films by Co–Sputtering Deposition", Journal of Crystal Growth 191 (1998), pp. 285–289, (Month Unknown).

*Primary Examiner*—Alan Diamond
*Attorney, Agent, or Firm*—Oblon, Spivak, McClelland, Maier & Neustadt, P.C.

[57] ABSTRACT

The present invention provides a method for producing a samarium monosulfide piezochromic thin film, and the present invention relates to a process for producing a thin film material at a high film formation rate by forming a samarium monosulfide thin film on a substrate by a reactive sputtering deposition process, which is a process for producing a samarium monosulfide (SmS) thin film, characterized by co-sputtering a disamarium trisulfide ($Sm_2S_3$) compound target and a samarium (Sm) metal target simultaneously in an inert gas discharge.

15 Claims, 3 Drawing Sheets

MANUFACTURING METHOD OF SAMARIUM SULFIDE THIN FILMS

DESCRIPTION OF THE INVENTION

The present invention relates to a technology of a material characterized by controlling properties of spectral reflectance and transmittance thereof in the range from the visible region to the infrared region including sunlight energy and a technology of a optical disc recording material based on phase transition thereof, and more specifically, this invention relates to a novel method for producing a samarium monosulfide thin film that is useful for a thin film material for a window glass which has a automatic or passive optical switching property on phase transition thereof according to a change in circumstantial temperature or pressure, a thin film material used for recording and deleting an information according to a change in optical properties of the thin film which is caused by laser light irradiation, and a thin film material for a non-linear optical device and the like.

BACKGROUND OF THE INVENTION

It is called a piezochromic phenomenon that optical properties of a material change reversibly according to a change of pressure. Samarium monosulfide (SmS) is a piezochromic material characterized by the optical properties being able to change upon pressure via a semiconductor-to-metal isostructural phase transition at 0.65 MPa and exhibits piezochromic characteristics. When a thin film thereof is used, for example, as a window coating material, it becomes possible to automatically control an energy of incident sunlight to be passed through the window according to a change of circumstantial temperature and stress thereof (including thermal stress introduced from a change of the temperature (proposed by the present inventors)). The pressure for phase transition of SmS is comparatively low among the known piezochromic materials and the phase transition is accompanied by a large change in optical properties from the visible wavelength to the infrared. The excellent optical switching property makes the material attractive for applications such as nonvolatile memory and possibly other kinds of smart devices with both sensing and actuating functions. An optical switching element, an information recording element, a non-linear optical device and the like which are utilizing a change of optical characteristics of the material have been reported [e.g., C. B. Greenberg: Thin Solid Films 251 (1994) 81.].

With respect to methods of the synthesis of a samarium monosulfide thin film, there have been examples of synthesis by CVD, a method of vacuum deposition and explosive evaporation and the like [e.g., 1) M. R. Jacobson, P. D. Hillman, A. L. Phillips, U. J. Gibson: SPIE Proc., vol. 428 (1983) 57., 2) C. F. Hickey and U. J. Gibson: J. Appl. Phys. 62 (1987) 3912., 3) Dieter W. Pohl and F. Holtzberg: Appl. Opt. 14 (1975) 1060., 4)V. V. Kaminskii, N. M. Volodin, T. B. Zhukova, M. V. Romanova, and G. A. Sosova: Sov. Phys. Solid State 33 (1991) 108.]. With respect to a sputtering process, an example of the synthesis of a samarium monosulfide thin film wherein $H_2S$ is employed as a reactive gas has been reported; however, the process of the synthesis employs $H_2S$, a toxic gas which is harmful to circumstances and health, and besides the synthesized thin film is powdery, does not adhere to a substrate and is chemically unstable film [M. R. Jacobson, P. D. Hillman, A. L. Phillips, U. J. Gibson: SPIE Proc., vol. 428 (1983) 57.]. Since stoichiometric SmS target could not be commercially obtained, there existed no example of synthesis of the film by employing the stoichiometric SmS target. Only the semiconductor phase were formed in most cases and it required mechanical polishing to transfer it into metal phase. There was one sturdy on direct formation of metal phase mixed with Sm (up to 40% wt %) by simultaneously sublimating Sm and S in vacuum.

As described above, several processes for producing a samarium monosulfide thin film including a sputtering process have been reported. However, it is apparent that the above-mentioned conventional techniques of production of the thin film have several disadvantages that a toxic gas such as hydrogen sulfide is used as a reactive gas, or that the thin film synthesized may contain a large amount of impurities, or that the structure control of the thin film is difficult or the like. Most of the thin films synthesized comprise a semiconductor phase, and it is necessary to pressurize the thin films by mechanical polishing them in order to cause a phase transition to a metal phase thereof [T. L. Bshalava, T. B. Zhukova, I. A. Smirnov, S. G. Shulman, and N. A. Yakovleva, Sov. Phys. Solid State 16 (1975) 2428.].

The present inventors have engaged in assiduous studies, under these circumstances, with a view to preparing a samarium monosulfide piezochromic thin film which can be comprising not only a semiconductor phase but also a metal phase stable at atmospheric pressure by using a new sputtering deposition process which is suited for industrial production characterized in that the film is synthesized without employing any toxic gas, at a high film formation rate, with few impurities, and as a result have accomplished the present invention.

SUMMARY OF THE INVENTION

The present invention provides a method for producing a samarium monosulfide piezochromic thin film.

The present invention relates to a method for producing a thin film material at a high film formation rate by forming a samarium monosulfide thin film on a substrate according to a reactive sputtering deposition process, which comprises a process for producing a samarium monosulfide (SmS) thin film, characterized in that a disamarium trisulfide ($Sm_2S_3$) compound target and a samarium (Sm) metal target are co-sputtered simultaneously.

A samarium monosulfide thin film produced according to the above process is the one with few impurities and has a dense structure, and hence the film exhibits excellent piezochromic characteristics. Moreover, since thin films, either a conventional semiconductor phase or a metal phase which is stable at atmospheric pressure can be formed by the co-sputtering deposition, a samarium monosulfide thin film produced can be expected to be employed as a thin film material which is suitable for the development of a window coating material, an optical switching element, an information recording element, a non-linear optical device and the like.

DETAILED DESCRIPTION OF THE INVENTION

That is, it is an object of the present invention to provide a new method for producing a samarium monosulfide thin film that is comprising a semiconductor phase and/or a metal phase which is stable at atmospheric pressure.

In addition, it is another object of the present invention to provide a method for producing a samarium monosulfide thin film at a high film formation rate without employing any toxic gas such as $H_2S$ which is employed in a conventional process.

Moreover, it is still another object of the present invention to provide a method for efficiently producing a samarium monosulfide thin film which contains few impurities, has a dense structure and exhibits excellent piezochromic characteristics.

In order to solve the above subjects, the following constitution is employed in the present invention.

(1) A method for producing a samarium monosulfide thin film material, which comprises a process of producing a samarium monosulfide (SmS) thin film on a substrate by co-sputtering of a samarium sulfide compound target in which a ratio of the sulfur element to the samarium element is higher than 1 and a samarium (Sm) metal target in an inert gas discharge.

(2) A method for producing a samarium monosulfide thin film material at a high film formation rate by forming the samarium monosulfide thin film on a substrate by a reactive sputtering deposition process, which comprises a process of producing a samarium monosulfide (SmS) thin film by co-sputtering of a disamarium trisulfide ($Sm_2S_3$) compound target and a samarium (Sm) metal target simultaneously.

(3) A method for producing a samarium monosulfide (SmS) thin film as stated in the above (1), wherein mixed targets which are made by compounding a disamarium trisulfide compound with a samarium metal powder at a prescribed ratio are sputtered.

(4) A method for producing a samarium monosulfide (SmS) thin film as stated in the above (2), wherein the samarium monosulfide (SmS) thin film comprises a semiconductor phase thin film and/or a metal phase thin film stable at atmospheric pressure.

(5) A method for producing a samarium monosulfide (SmS) thin film as stated in the above (3), wherein the samarium monosulfide (SmS) thin film comprises a semiconductor phase thin film and/or a metal phase thin film stable at atmospheric pressure.

(6) A method for producing a samarium monosulfide (SmS) thin film as stated in the above (2), wherein the thin film is synthesized without employing any toxic gas such as $H_2S$.

(7) A method for producing a samarium monosulfide (SmS) thin film as stated in the above (3), wherein the thin film is synthesized without employing any toxic gas such as $H_2S$.

(8) A method for producing a samarium monosulfide (SmS) thin film as stated in the above (2), wherein a control of electric power distribution to the targets is performed.

(9) A method for producing a samarium monosulfide (SmS) thin film as stated in the above (3), wherein an adjustment of a metal component of the targets is performed.

Subsequently, the present invention will be described in more detail.

In this invention, the sputter-deposition of SmS of either the semiconductor phase or the metal one stable at atmospheric pressure is provided for the first time.

The present invention relates to a method for producing a samarium monosulfide (SmS) thin film material by the processes of co-sputtering deposition of a disamarium trisulfide ($Sm_2S_3$) compound target and a samarium (Sm) metal target in an inert gas discharge simultaneously and controlling electric powder distribution to the targets, as described above. Moreover, the present invention relates to a method for producing a samarium monosulfide (SmS) thin film material by the process of sputtering deposition of mixed targets which are made by mixing a disamarium trisulfide compound with a samarium metal powder at a prescribed ratio in an inert gas discharge.

Thin films of samarium monosulfide, either the semiconductor phase (S-SmS) or the metal one (M-SmS) stable at atmospheric pressure, are formed for the first time by co-sputtering of a samarium sulfide such as $Sm_2S_3$ compound target and a Sm metal target in an inert gas discharge. The reactive species (sulfur) is self-provided in a controlable way from the dissociation of the samarium sulfide compound during sputtering, thus minimizing the conventional use of toxic $H_2S$ or contaminative solid sources.

According to the above process, since the sulfur element which is to comprise a composition of the desired thin film substance by reacting with samarium is provided by sputtering deposition of a samarium sulfide compound target in which a ratio of the sulfur element to the samarium element is higher than 1, it is unnecessary to add a toxic, reactive gas such as hydrogen sulfide. Hence, the above process can be deemed to be a process which is taking the health of an operator and circumstances into consideration.

According to the above process, a much higher film formation rate can be accomplished by employing a metal target which has a higher sputtering ratio together with a compound target as compared with the case of employing only a compound target. Also in the case of employing mixed targets which are made by mixing a samarium metal powder with an $Sm_2S_3$ compound at a prescribed ratio, a higher film formation rate of the metal part makes a contribution to the improvement of a film formation rate of the whole of the film as compared with the case of employing only a single phase compound target; in addition, according to the improvement of the electrical conductivity and thermal conductivity of targets caused by the addition of the metal target, not only a high-frequency sputtering deposition process but also a direct current sputtering deposition process with excellent efficiency can be employed.

In the above process, a thin film which is comprising a metal phase stable at atmospheric pressure can be synthesized by adjusting a composition ratio of a samarium metal in the thin film to slightly over that of a samarium monosulfide (SmS) as compared with stoichiometric composition rate thereof. That is, the synthesis of the metal phase thin film which is stably present at atmospheric pressure can be accomplished by controlling electric power distribution to the targets in the case of using a binary and simultaneous sputtering deposition, and by adjusting the metal component in the mixed targets slightly excessive in the case of employing the mixed targets. Thus, in the present invention, it is important for the production of a desired thin film material to control electric power distribution to the targets and to adjust the metal component in the mixed targets.

A general-purpose sputtering device is employed for the production of the above thin film, and therefore, in the present invention, any device, irrespective of kind thereof, may be employed so far as it can perform the above process of the invention, and the device is not particularly restricted.

Disamarium trisulfide ($Sm_2S_3$) is preferably employed as a compound target in the production of the above thin film, however, as said compound target, the samarium sulfides in which a ratio of the sulfur element to the samarium element is higher than 1 (e.g., $Sm_3S_4$) are also used preferably, and the kinds of the samarium sulfides as said compound target are not particularly restricted. In addition, with respect to a samarium metal which is employed as a metal target, the kind and form of the samarium metal as said metal target are not particularly restricted. Moreover, as a substrate, for example, proper ones such as glass, a silicon single crystal and a sapphire and the like can be employed.

In the above process for producing a thin film, a method of controlling composition of the film by controlling electric power distribution to the targets is preferably employed in the case of performing a binary and simultaneous sputtering deposition; however, other methods such as a method of controlling the switching time of a shutter of a sputtering device may be employed as a method of controlling composition thereof, and the kind thereof is not particularly restricted.

X-ray diffraction, Rutherford backscattering spectrometry and spectrophotometry are employed in film characterization. A stoichiometric S-SmS film is formed by optimizing the powder ratio applied to the two targets, and a M-SmS film is directly obtained by slightly enriching the film with Sm. The films are dense with little impurity. The S-SmS and M-SmS films differ substantially in optical properties from the visible region to the infrared region.

A samarium monosulfide thin film produced according to the above process of the invention has the following properties and characteristics.

(1) Since the film contains few impurities and has a dense structure, it exhibits excellent piezochromic characteristics.

(2) Since the films, either a semiconductor phase or a metal phase which is stable at atmospheric pressure can be formed in the process, it can meet different needs in accordance with an appropriate object.

(3) It becomes possible to generate internal stress in a thin film in advance by employing a sputtering deposition process characterized in that the internal stress of the thin film can be controlled by changing a parameter of the process, and thereby it becomes possible to establish the value of pressure required for the phase transition of a piezochromic thin film.

(4) When it is made a thin film of semiconductor phase in advance, it can be changed to a metal phase with a low spectral transmittance by pressurizing it, while when it is made a thin film of metal phase in advance, it can be changed to a semiconductor phase by heating it; hence, various kinds of products can be produced easily in accordance with required needs.

The co-sputtering deposition described above has various advantages against the methods in the prior art.

First, the sputtering is reactive with the sulfur species self-provided by the dissociation of a samarium sulfide from the compound target, thus eliminating the use of toxic $H_2S$ or a contaminative S source in the conventional PVD deposition of sulfide. Second, since a metal target used simultaneously can be direct current-powered, and approximately one-third of Sm in SmS will be provided by sputtering the metal, a high deposition rate, a lower energy consumption can be expected compared to the sputtering of only a compound target. Third, technologies used in sputter deposition for quality and microstructural control, particularly those for the control of film stress which is of great importance for the piezochromic SmS film, can be applied. Finally, the sputtering configuration and its variations are easy to construct.

EXAMPLES

Subsequently, the present invention will be described specifically according to examples, but this invention is not restricted by the examples.

EXAMPLE 1

(1) Method

In the present Example, a magnetron sputtering deposition device was employed as a sputtering deposition device. In said device, three cathodes can be provided, and in each cathode, electric power can be controlled optionally by using a high-frequency electric source or a direct current electric source. The temperature of the substrate to be used can be controlled from room temperature to 800° C. In one cathode, a target, which was prepared by the processes of putting a commercially available disamarium trisulfide powder (purity: 99.9%) on a stainless steel saucer and pressing the powder by proper pressure to obtain the target, was placed. In another cathode was placed a commercially available samarium metal target (purity: 99.99%). A film was formed by the processes of evacuating the vacuum system to less than $1\times10^{-4}$ Pa, and then pre-sputtering the targets at total pressure of 1.33 Pa for 30 minutes in an introducing argon gas discharge to form the film. As substrates were employed glass, a silicon single crystal, sapphire and the like.

That is, as a result of applying a high-frequency electric power of 100 W to a disamarium trisulfide powder target, and a direct voltage of 230 V and a direct current of 0.12 A to a samarium metal target, and performing sputtering deposition of the targets under the conditions of the temperature of a substrate of 400° C. and an argon gas pressure of 1.33 Pa, a samarium monosulfide semiconductor phase thin film was formed on said substrate.

The crystal phases in the films were identified by thin-film X-ray diffraction (XRD). The stoichiometry was studied by Rutherford backscattering spectrometry (RBS), and the composition was determined using a computer simulation program RUMP. The absolute spectral transmittance (at normal incident) in the 300–2500 nm wavelength range were measured with a spectrophotometer.

(2) Results

Figure 1:
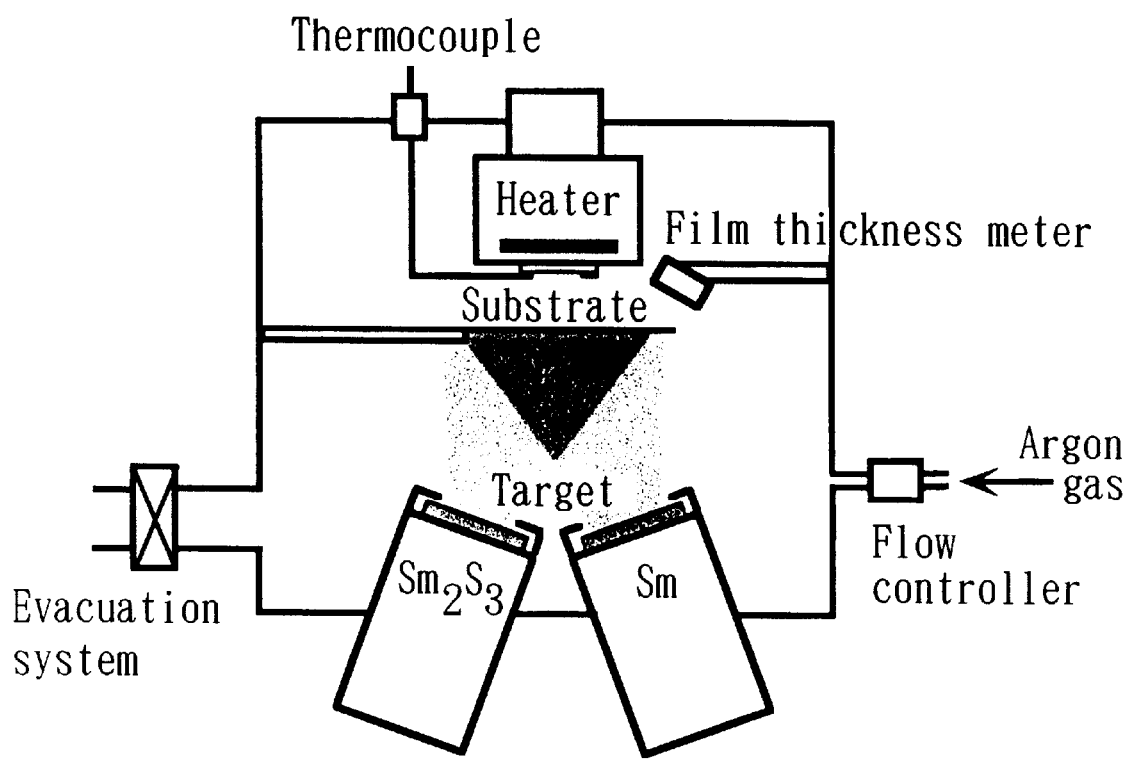
FIG. 1 shows a schematic diagram of a sputter system for the deposition of SmS to be employed in the present invention.
Figure 2:
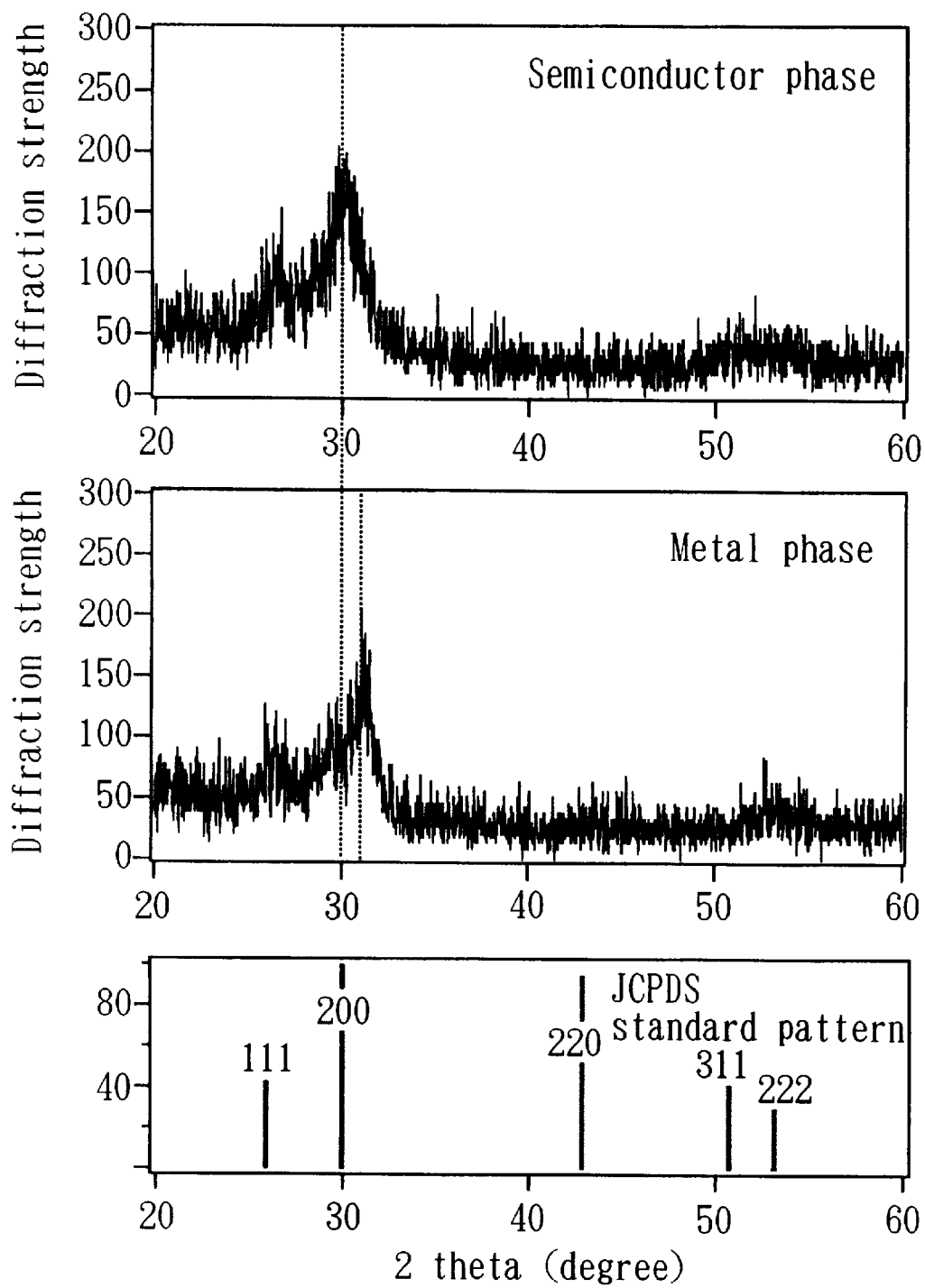
FIG. 2 shows the X-ray diffraction patterns of a samarium monosulfide semiconductor phase synthesized by a method of multi-target sputtering deposition (upper part), and a metal phase (middle part), and a JCPDS standard pattern of the semiconductor phase (lower part)

In FIG. 2 are shown an X-ray diffraction pattern of the samarium monosulfide semiconductor phase thin film synthesized by the above method (upper part) and a JCPDS standard pattern of the semiconductor phase (lower part)

As is apparent from FIG. 2, the X-ray diffraction pattern of the synthesized samarium monosulfide semiconductor phase thin film is in a good agreement to the JCPDS standard pattern, and thereby the effectiveness of the present invention can be proved.

Figure 3:
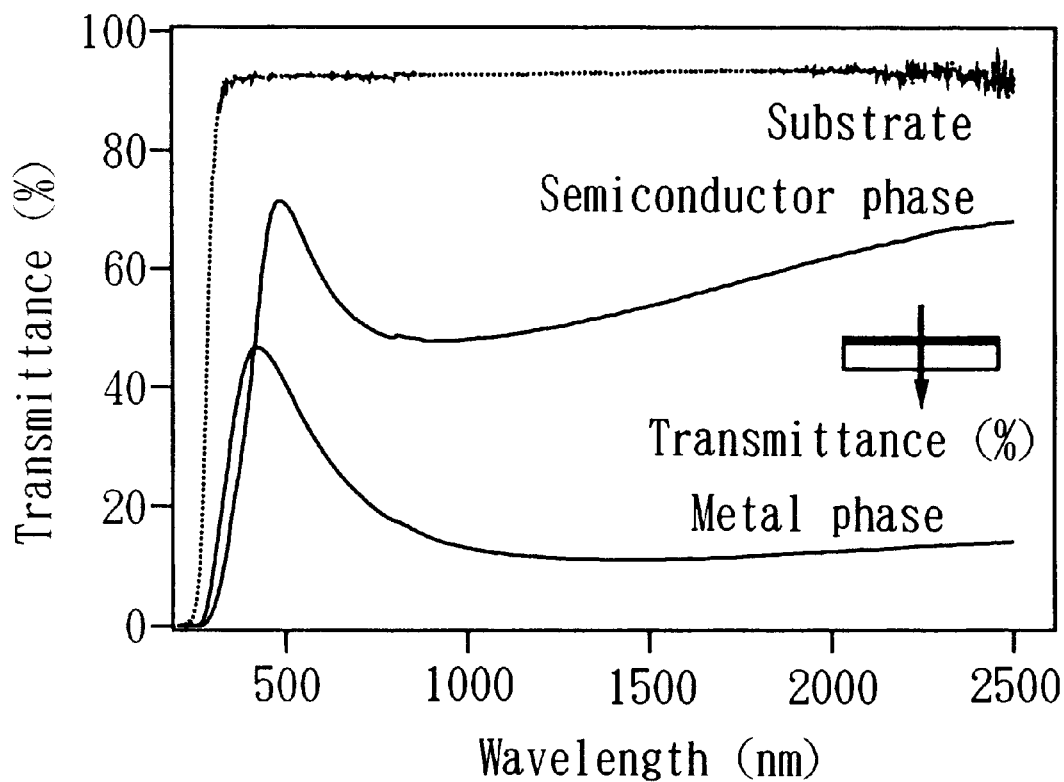
FIG. 3 shows the absolute spectral transmittance spectrum of a samarium monosulfide semiconductor phase thin film (thickness: 85 nm) and a metal phase thin film (thickness: 65 nm) formed on a pyrex substrate with a thickness of 0.5 mm.

In addition, in FIG. 3 is shown an absolute spectral transmittance spectrum of a samarium monosulfide semiconductor phase (thickness: 85 nm) which is formed on a pyrex substrate with a thickness of 0.5 mm.

As is apparent from FIG. 3, the synthesized samarium monosulfide semiconductor phase thin film exhibits excellent high transparency in the range from the visible light region to the near infrared region.

EXAMPLE 2

(1) Method

A samarium monosulfide thin film was prepared by a method same as that of the Example 1.

In this Example, as a result of applying a high-frequency electric power of 100 W to a disamarium trisulfide powder target, and a direct voltage of 230 V and a direct current of 0.14 A to a samarium metal target, and performing sputtering deposition of the targets under the conditions of the temperature of a substrate of 400° C. and an argon gas pressure of 1.33 Pa, a samarium monosulfide metal phase thin film was formed on said substrate.

(2) Results

In FIG. 2 are shown an X-ray diffraction pattern of the samarium monosulfide metal phase thin film synthesized by the above method (middle part) and a JCPDS standard pattern of the semiconductor phase (lower part).

As is apparent from FIG. 2, the position of the strongest peak of the X-ray diffraction pattern of the samarium monosulfide metal phase thin film (FIG. 2, middle part) which is synthesized by the above method shifts to a side of a higher angle than that of the semiconductor phase thin film (FIG. 2, upper part) and exhibits the characteristics of a metal phase with a small lattice constant.

With a slight increase in direct current to the Sm target, films with a golden yellow color characteristics of the metal phase and being stable at atmospheric pressure were repeatedly formed.

In addition, in FIG. 3 is shown an absolute spectral transmittance spectrum of a samarium monosulfide metal phase (thickness: 65 nm) which is formed on a pyrex substrate with a thickness of 0.5 mm.

As is apparent from FIG. 3, the samarium monosulfide metal phase thin film which is synthesized by the above method exhibits slight transparency in the range of visible light, but it shows a large decrease in transmittance in the near infrared region; thus it apparently exhibits metal characteristics.

The present invention has been described above according to examples; however, the present invention is not restricted to the above Examples but can be performed an any manner so far as the constitution described in the scope of claims is not altered.

As described above in detail, the present invention provides a novel method for producing a samarium monosulfide thin film without employing any toxic gas at a high film formation by sputtering deposition of a disamarium trisulfide ($Sm_2S_3$) compound target and a samarium (Sm) metal target simultaneously, or by sputtering deposition of mixed targets which are made by mixing a disamarium trisulfide compound with a samarium metal powder at a prescribed ratio. The process of the present invention can protect the health of an operator and check environmental pollution to the minimum. A samarium monosulfide thin film produced by said process contains few impurities and has a dense structure, and hence exhibits excellent piezochromic characteristics thereof. According to the method of the present invention, thin films of samarium monosulfide, either a conventional semiconductor phase or a metal phase stable at atmospheric pressure can be formed without applying any pressure thereon, and hence, the produced samarium monosulfide thin film is expected to be employed as a thin film material which is suitable for the development of a window coating material, an optical switching element, an information recording element, a non-linear optical device and the like.

What is claimed is:

1. A method for producing a samarium monosulfide film, the method comprising co-sputtering a samarium sulfide target and a samarium metal target in an inert gas discharge to form the samarium monosulfide film, wherein a ratio of sulfur to samarium in the samarium sulfide target is greater than 1.

2. A method for producing a samarium monosulfide film, the method comprising co-sputtering a disamarium trisulfide target and a samarium metal target to form the samarium monosulfide film.

3. The method as claimed in claim 1, wherein the samarium sulfide target comprises disamarium trisulfide compounded with samarium metal powder.

4. The method as claimed in claim 2, wherein the samarium monosulfide film comprises at least one of a semiconductor phase and a metal phase at atmospheric pressure.

5. The method as claimed in claim 1, wherein the samarium monosulfide film comprises at least one of a semiconductor phase and a metal phase at atmospheric pressure.

6. The method as claimed in claim 2, wherein the samarium monosulfide film is synthesized without employing $H_2S$.

7. The method as claimed in claim 3, wherein the samarium monosulfide film is synthesized without employing $H_2S$.

8. The method as claimed in claim 2, further comprising controlling electric power distribution to the disamarium trisulfide target and the samarium metal target.

9. The method as claimed in claim 3, further comprising setting a ratio of sulfur to samarium in the samarium sulfide target to be greater than 1 by adjusting an amount of the samarium metal powder in the samarium sulfide target.

10. The method as claimed in claim 1, wherein the samarium sulfide target comprises at least one of $Sm_2S_3$ and $Sm_3S_4$, and the samarium metal target comprises Sm.

11. The method as claimed in claim 2, wherein the disamarium trisulfide target consists essentially of $Sm_2S_3$, and the samarium metal target consists essentially of Sm.

12. The method as claimed in claim 1 wherein the samarium monosulfide film comprises a metal phase enriched in samarium.

13. The method as claimed in claim 2 wherein the samarium monosulfide film comprises a metal phase enriched in samarium.

14. The method as claimed in claim 1, wherein a samarium sulfide target and a separate samarium metal target simultaneously co-sputter the samarium monosulfide film.

15. The method as claimed in claim 2, wherein a disamarium trisulfide target and a separate samarium metal target simultaneously co-sputter the samarium monosulfide film.

* * * * *